US011018001B2

United States Patent
Kim et al.

(10) Patent No.: US 11,018,001 B2
(45) Date of Patent: May 25, 2021

(54) METHOD OF GROWING TWO-DIMENSIONAL TRANSITION METAL DICHALCOGENIDE THIN FILM AND METHOD OF MANUFACTURING DEVICE INCLUDING THE SAME

(71) Applicant: Samsung Electronics Co., Ltd., Suwon-si (KR)

(72) Inventors: Haeryong Kim, Seongnam-si (KR); Hyeonjin Shin, Suwon-si (KR); Jaeho Lee, Seoul (KR); Sanghyun Jo, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/922,330

(22) Filed: Jul. 7, 2020

(65) Prior Publication Data

US 2020/0335335 A1    Oct. 22, 2020

Related U.S. Application Data

(63) Continuation of application No. 16/012,938, filed on Jun. 20, 2018, now Pat. No. 10,741,389.

(30) Foreign Application Priority Data

Nov. 29, 2017  (KR) .......................... 10-2017-0161855

(51) Int. Cl.
*H01L 21/02*  (2006.01)
*H01L 29/66*  (2006.01)
(Continued)

(52) U.S. Cl.
CPC .... *H01L 21/02568* (2013.01); *H01L 21/0262* (2013.01); *H01L 21/02485* (2013.01);
(Continued)

(58) Field of Classification Search
CPC ................................................ H01L 21/02568
(Continued)

(56) References Cited

U.S. PATENT DOCUMENTS 9,023,221 B2   5/2015  Woo et al.
9,644,263 B2   5/2017  Kim et al.
(Continued)

FOREIGN PATENT DOCUMENTS

KR   10-2012-0119789 A   10/2012
KR   10-1564241 B1       11/2015

OTHER PUBLICATIONS

Wang, Qing Hua et al. "Electronics and optoelectronics of two-dimensional transition metal dichalcogenides." *Nature Nanotechnology* 7 (2012): 699-712.
(Continued)

*Primary Examiner* — Ajay Arora
(74) *Attorney, Agent, or Firm* — Harness, Dickey & Pierce, P.L.C.

(57) ABSTRACT

A method of growing a two-dimensional transition metal dichalcogenide (TMD) thin film and a method of manufacturing a device including the two-dimensional TMD thin film are provided. The method of growing the two-dimensional TMD thin film may include a precursor supply operation and an evacuation operation, which are periodically and repeatedly performed in a reaction chamber provided with a substrate for thin film growth. The precursor supply operation may include supplying two or more kinds of precursors of a TMD material to the reaction chamber. The evacuation operation may include evacuating the two or more kinds of precursors and by-products generated therefrom from the reaction chamber.

15 Claims, 15 Drawing Sheets

(51) Int. Cl.
    *H01L 29/786*     (2006.01)
    *H01L 29/778*     (2006.01)
    *H01L 29/24*     (2006.01)

(52) U.S. Cl.
    CPC ...... H01L 29/66969 (2013.01); H01L 29/778 (2013.01); H01L 29/786 (2013.01); *H01L 21/0242* (2013.01); *H01L 21/02376* (2013.01); *H01L 21/02381* (2013.01); *H01L 21/02422* (2013.01); *H01L 29/24* (2013.01)

(58) Field of Classification Search
    USPC .......................................................... 438/478
    See application file for complete search history.

(56) References Cited

U.S. PATENT DOCUMENTS

| | | | |
|---|---|---|---|
| 2004/0009649 A1* | 1/2004 | Kub | B82Y 30/00 |
| | | | 438/459 |
| 2016/0168694 A1 | 6/2016 | Min | |
| 2016/0240376 A1* | 8/2016 | Yeh | C23C 16/482 |
| 2016/0314968 A1* | 10/2016 | Kim | H01L 21/0262 |

OTHER PUBLICATIONS

Xia, Fengnian et al. "Two-dimensional material nanophotonics." *Nature Photonics* 8 (2014): 899-907.

Liu, Yingnan et al. "Mesoscale Imperfections in $MoS_2$ Atomic Layers Grown by a Vapor Transport Technique." *Nano Letters* 14 (2014): 4682-4686.

Kang et al., "High-mobility three-atom-thick semiconducting films with wafer-scale homogeneity", Nature, Apr. 30, 2015, vol. 520(7549), pp. 656-660.

\* cited by examiner

< COMPARATIVE EXAMPLE >

1 μm

Relatively light portions

Relatively dark portions

METHOD OF GROWING TWO-DIMENSIONAL TRANSITION METAL DICHALCOGENIDE THIN FILM AND METHOD OF MANUFACTURING DEVICE INCLUDING THE SAME

CROSS-REFERENCE TO RELATED APPLICATION

This application is a continuation of U.S. patent application Ser. No. 16/012,938, filed on Jun. 20, 2018, which claims the benefit of Korean Patent Application No. 10-2017-0161855, filed on Nov. 29, 2017, in the Korean Intellectual Property Office, the disclosure of each of which is incorporated herein in its entirety by reference.

BACKGROUND

1. Field

The present disclosure relates to methods of growing a two-dimensional transition metal dichalcogenide (TMD) thin film and methods of manufacturing a device including the two-dimensional TMD thin film.

2. Description of the Related Art

A two-dimensional (2D) material is a single-layer or half-layer solid in which atoms form a crystal structure. An example of a typical two-dimensional material is graphene. Starting with research on graphene, research and development on various two-dimensional materials having semiconductor or insulator properties have been conducted. The two-dimensional materials are attracting attention as a next generation material that may overcome the limitation of existing devices.

However, it is difficult to grow two-dimensional material having high quality to a uniform thickness on a wafer scale. Although methods of using metal organic precursors have been introduced to solve scalability problems, that is, large area growth problems, the time required for monolayer growth is as long as about 26 hours, and thus, there are still process issues.

SUMMARY

Provided are methods of growing a two-dimensional transition metal dichalcogenide (TMD) thin film having a larger area, more uniformity, and/or higher quality.

Provided are methods of growing a wafer scale two-dimensional TMD thin film in a shorter time.

Provided are methods of manufacturing a device using the two-dimensional TMD thin film growth method.

Additional aspects will be set forth in part in the description which follows and, in part, will be apparent from the description, or may be learned by practice of the presented example embodiments.

According to an aspect of an example embodiment, a method of growing a two-dimensional transition metal dichalcogenide (TMD) thin film includes a precursor supply operation and an evacuation operation, which are periodically and repeatedly performed in a reaction chamber provided with a substrate for thin film growth, wherein the precursor supply operation includes supplying two or more kinds of precursors of a TMD material to the reaction chamber, and the evacuation operation includes evacuating the two or more kinds of precursors and by-products generated therefrom from the reaction chamber.

The precursor supply operation may have a duration ranging from 30 seconds to 180 seconds in each period thereof.

The evacuation operation may have a duration ranging from 5 seconds to 120 seconds in each period thereof.

A single duration of the evacuation operation may be shorter than a single duration of the precursor supply operation.

A reaction temperature for growth of the two-dimensional TMD thin film may range from 550° C. to 1050° C.

The substrate may include any one of Si, $SiO_2$, $Al_2O_3$, graphene, and a TMD material.

In the precursor supply operation, the two or more precursors may be simultaneously or separately supplied into the reaction chamber.

In the precursor supply operation, a catalytic gas may be further supplied together with the two or more precursors.

The two-dimensional TMD thin film may be grown using a chemical vapor deposition (CVD) process, a plasma-enhanced chemical vapor deposition (PECVD) process, a metal organic chemical vapor deposition (MOCVD) process, or a combination of at least two of them.

The two or more kinds of precursors may include a precursor material of at least one of metal elements of Groups 4B, 5B, 6B, and 7B and a precursor material of one of chalcogen elements of S, Se, and Te.

The two or more precursors may further include a precursor material of a doping element.

A material of the two-dimensional TMD thin film may be represented by $MX_2$, wherein M is one of Mo, W, Nb, V, Ta, Ti, Zr, Hf, Tc, and Re, and X is one of S, Se, and Te.

The method may further include forming a plurality of TMD materials different from each other in a multi-layered structure.

The two-dimensional TMD thin film may be formed on a wafer having a size of 6 inches or more.

According to an aspect of another example embodiment, a method of manufacturing a two-dimensional material-containing device includes growing a two-dimensional transition metal dichalcogenide (TMD) thin film on a substrate by using the above-described method, and forming a device portion including the two-dimensional TMD thin film.

The two-dimensional material-containing device may include at least one of a transistor, a diode, an optoelectronic device, a tunneling device, a logic device, and a memory device.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
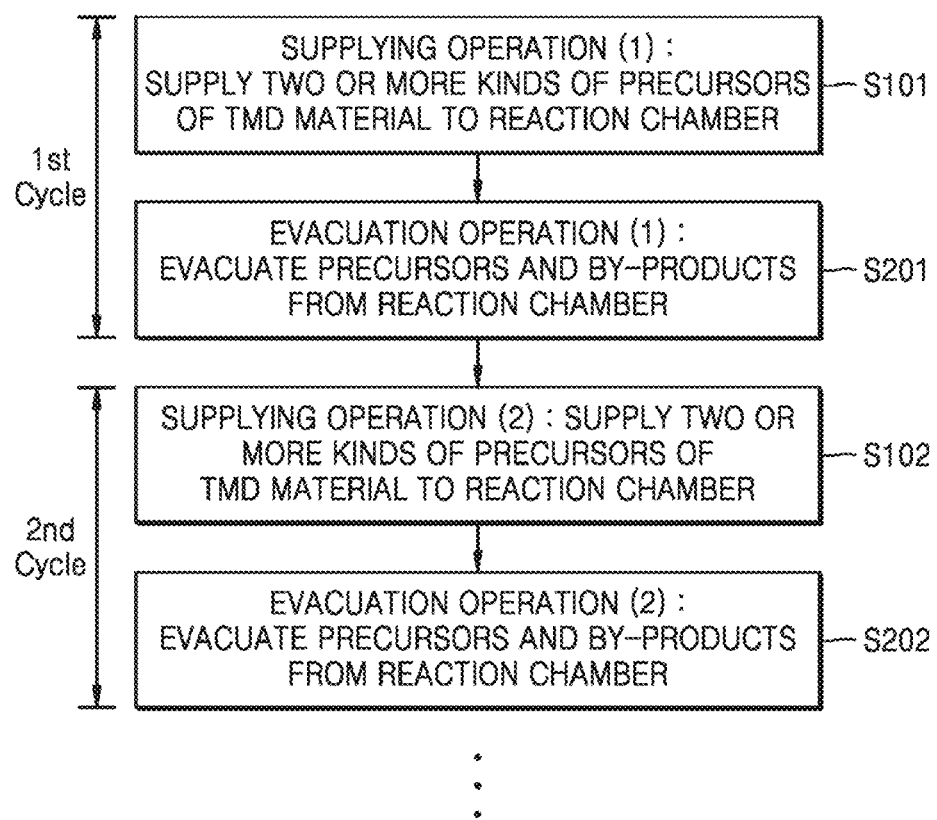
FIG. 1 is a flowchart illustrating a method of growing a two-dimensional transition metal dichalcogenide (TMD) thin film, according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Expressions such as "at least one of," when preceding a list of elements, modify the entire list of elements and do not modify the individual elements of the list It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, methods of growing a two-dimensional transition metal dichalcogenide (TMD) thin film and methods of manufacturing a device including the two-dimensional TMD thin film, according to example embodiments, will be described in detail with reference to the accompanying drawings. The widths and thicknesses of layers or regions illustrated in the accompanying drawings may be somewhat exaggerated for clarity and ease of description. Like reference numerals designate like elements throughout the specification.

FIG. 1 is a flowchart illustrating a method of growing a two-dimensional TMD thin film, according to an example embodiment.

Referring to FIG. 1, the method of growing a two-dimensional TMD thin film may include precursor supply operations S101 and S102 and evacuation operations S201 and S202, which are periodically (and/or repeatedly) performed in a reaction chamber provided with a substrate for thin film growth. The precursor supply operations S101 and S102 and the evacuation operations S201 and S202 may be alternately repeated. Each of the precursor supply operations S101 and S102 may include supplying two or more kinds of precursors of a TMD material to the reaction chamber. Each of the evacuation operations S201 and S202 may include evacuating the precursors and by-products produced therefrom from the reaction chamber.

The two or more kinds of precursors supplied to the reaction chamber in the precursor supply operations S101 and S102 are for forming a two-dimensional TMD, and may include a precursor material of at least one metal element and a precursor material of at least one chalcogen element. For example, the two or more kinds of precursors may include a precursor material (first precursor material) of one of metal elements of Groups 4B, 5B, 6B, and 7B and a precursor material (second precursor material) of one of chalcogen elements of S, Se, and Te. Examples of the metal elements of the Groups 4B, 5B, 6B and 7B may include Mo, W, Nb, V, Ta, Ti, Zr, Hf, Tc, Re and the like. In addition, the two or more kinds of precursors may further include a precursor material (third precursor material) of at least one doping element. In each of the precursor supply operations S101 and S102, the two or more kinds of precursors may be supplied simultaneously or separately or overlappingly into the reaction chamber. Here, supplying separately may mean supplying precursors sequentially either overlapping or not. In example embodiments, for example, a precursor material (second precursor material) of a chalcogen element may be first supplied and then a precursor material of a metal element (first precursor material) may be supplied.

In the precursor supply operations S101 and S102, a catalytic gas may be further supplied into the reaction chamber together with the two or more kinds of precursors. The catalytic gas may include, for example, $H_2$ gas. The catalytic gas may, for example, remove an ethyl group of a chalcogen source, e.g., the precursor of the chalcogen element. Thus, a reaction between the chalcogen source and a metal source (e.g., the precursor of the metal element) may be promoted by the catalytic gas.

The evacuation operations S201 and S202 may be, for example, vacuum evacuation operations. More specifically, the evacuation operations S201 and S202 may include a process of injecting an inert gas such as $N_2$ gas into the reaction chamber and performing evacuation by using a vacuum pump connected to the reaction chamber. Through the process, the precursors and the by-products produced therefrom may be evacuated from the reaction chamber. In example embodiments, the concentration and reaction rate of the precursors on the substrate in the reaction chamber may be controlled, and thus, a nucleation rate may be controlled during the formation of the TMD thin film and the lateral growth of the TMD thin film may be better performed. This will be described in more detail below.

The time of each of the precursor supply operations S101 and S102 and the evacuation operations S201 and S202 may be appropriately selected. For example, each of the precursor supply operations S101 and S102 may have a single period (e.g. duration time) in the range of about 30 seconds to about 180 seconds, and each of the evacuation operations S201 and S202 may have a single period in the range of about 5 seconds to about 120 seconds. The single duration of each of the evacuation operations S201 and S202 may be less than the single duration of each of the precursor supply operations S101 and S102. However, this case is exemplary, and the single duration of each of the precursor supply operations S101 and S102 and the single duration of each of the evacuation operations S201 and S202 are not limited to those described above. Also, as required, the single duration of each of the evacuation operations S201 and S202 may be equal to or greater than the single duration of the precursor supply operations S101 and S102.

As the precursor supply operations S101 and S102 and the evacuation operations S201 and S202 are alternately performed, a two-dimensional TMD thin film may be grown on a substrate. In example embodiments, a reaction temperature set for growing the two-dimensional TMD thin film may be, for example, about 550° C. to about 1050° C. That is, the temperature of the substrate in a process of growing the two-dimensional TMD thin film may be maintained at about 550° C. to about 1050° C. However, this temperature range is exemplary and may vary as required.

The substrate for the growth of the two-dimensional TMD thin film may include any one of, for example, Si, $SiO_2$, $Al_2O_3$, graphene, and a TMD material. Here, the TMD material may be a different TMD material than the material of a two-dimensional TMD thin film to be grown. The kind and material of the substrate are not limited to those described above and may be varied. The two-dimensional TMD thin film may be formed on a wafer having a size of 6 inches or more. That is, the substrate may be a wafer having a size of 6 inches or more. The method of growing a two-dimensional TMD thin film according to an example embodiment may be suitable for large area growth. It is also apparent that the method of example embodiments may be applied to a substrate of 6 inches or less.

The growth of the two-dimensional TMD thin film according to example embodiments may be performed using a chemical vapor deposition (CVD) process, a plasma-enhanced chemical vapor deposition (PECVD) process, a metal organic chemical vapor deposition (MOCVD) process, or a combination of at least two thereof. The two-dimensional TMD thin film may be grown using a modified CVD process rather than a general CVD process. The modified CVD process may be a periodic process including the evacuation operation as described above. Plasma may be used in the modified CVD process, and/or metal organic precursors may be used.

The material of the two-dimensional TMD thin film formed by the above-described method may be represented by $MX_2$. Here, M may be one of Mo, W, Nb, V, Ta, Ti, Zr, Hf, Tc and Re, and X may be one of S, Se and Te. As a specific example, the TMD thin film may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or the like. The TMD thin film may include a two-dimensional material. The two-dimensional material is a single-layer or half-layer solid in which atoms form a crystal structure. The two-dimensional material may have a layered structure. Electronically, the two-dimensional material may be defined as a material whose density of state (DOS) follows quantum well behavior. Since the DOS of a material in which a plurality of two-dimensional unit material layers (single layers) are stacked may follow quantum well behavior, a structure in which the single layer is repeatedly stacked may also be referred to as "two-dimensional material". Layers of the two-dimensional material may be bonded by van der Waals bonding.

The two-dimensional TMD thin film formed according to example embodiments may further include a doping element "A", and in example embodiments, the material of the two-dimensional TMD thin film may be represented by A-doped $MX_2$ or AMX2. $AMX_2$ may be $A_xM_{1-x}X_2$. The doping element "A" may be a metal (e.g., a transition metal). The content of the doping element "A" may be about 5 wt % or less or about 2 wt % or less.

According to example embodiments described above, a two-dimensional TMD thin film having better uniformity and/or higher quality may be formed in a larger area in a shorter time. Since a periodic growth process including the evacuation operation is used, a nucleation rate may be controlled during the formation of the TMD thin film and the lateral growth of the TMD thin film may be better performed. As the vertical growth of the TMD thin film is suppressed and the lateral growth thereof is promoted, growth rate anisotropy may be controlled and a two-dimensional TMD thin film having a more uniform thickness and/or improved quality may be formed. For example, when a TMD thin film having a monolayer structure is formed on a 6-inch wafer, a first layer (monolayer) may be uniformly formed in an area of about 95% or more of the TMD thin film and a second layer may be formed in a small area of about 5% or less of the TMD thin film. The TMD thin film having the monolayer structure may be formed quickly within about 15 minutes or within about 12 minutes. Thus, example embodiments of the inventive concepts may be advantageously applied to development and commercialization of a device to which a two-dimensional TMD thin film is applied.

In conventional methods, it is difficult to grow a TMD thin film in a wafer scale, and it is difficult to obtain the uniformity of a continuous film. Although a method of using metal organic precursors to solve a scalability problem has been introduced, the time required for monolayer growth is very long, about 26 hours, and thus, commercialization is not possible. However, according to example embodiments of the inventive concepts, a larger-area TMD thin film may be formed and a more universal film uniformity thereof may be obtained, and in addition, a high-quality two-dimensional TMD thin film may be formed in a shorter time by an easier process.

Figure 2:
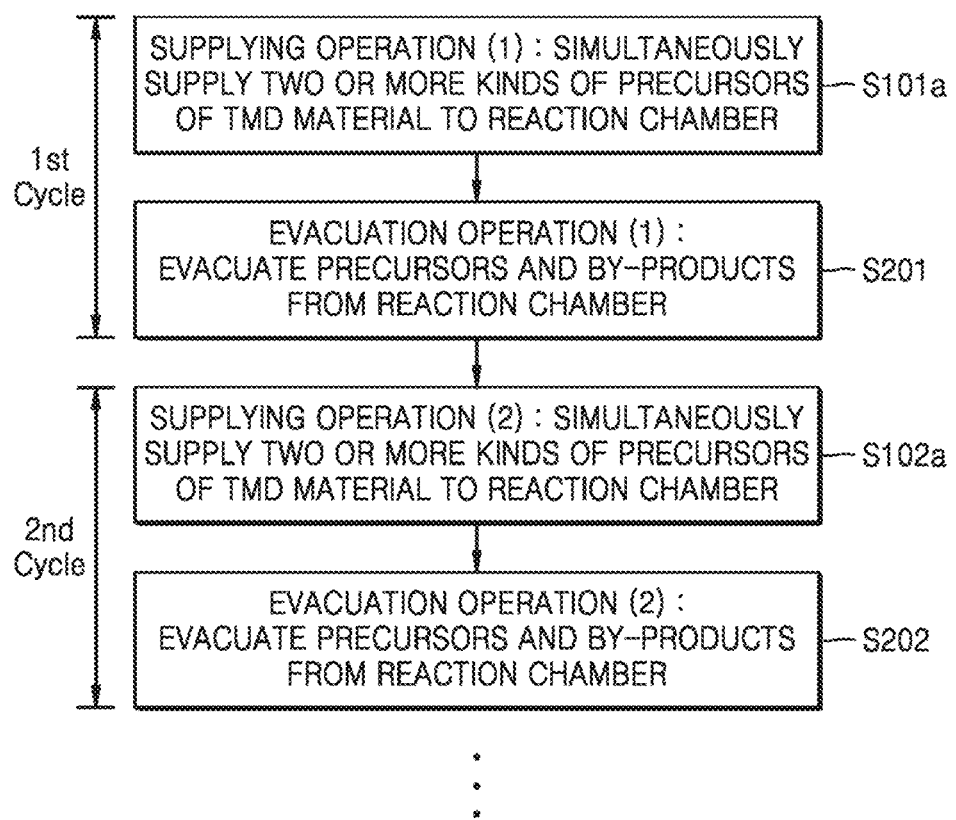
FIG. 2 is a flowchart illustrating a method of growing a two-dimensional TMD thin film, according to an example embodiment.

FIG. 2 is a flowchart illustrating a method of growing a two-dimensional TMD thin film, according to an example embodiment.

Referring to FIG. 2, the method of growing a two-dimensional TMD thin film according to example embodiments may periodically repeat precursor supply operations S101a and S102a and evacuation operations S201 and S202. Each of the precursor supply operations S101a and S102a may include simultaneously supplying two or more kinds of precursors of a TMD material to a reaction chamber. Each of the precursor supply operations S101a and S102a may further include supplying a catalytic gas to the reaction chamber in addition to the two or more kinds of precursors.

Figure 3:
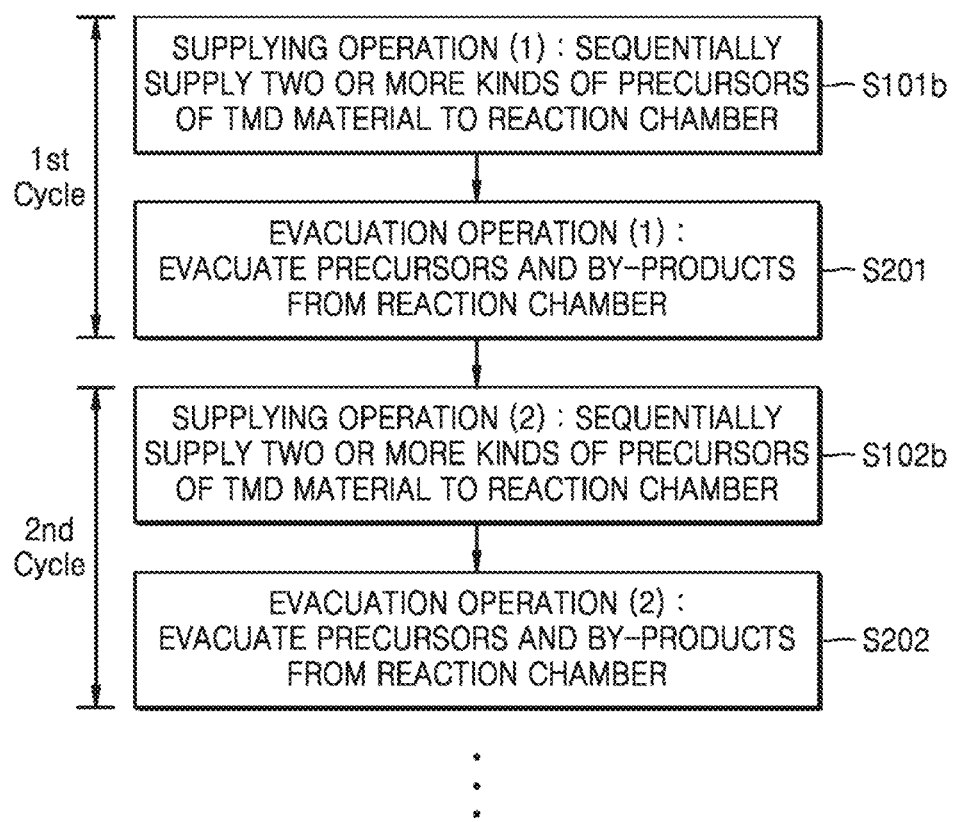
FIG. 3 is a flowchart illustrating a method of growing a two-dimensional TMD thin film, according to another example embodiment.

FIG. 3 is a flowchart illustrating a method of growing a two-dimensional TMD thin film according to another example embodiment.

Referring to FIG. 3, the method for growing a two-dimensional TMD thin film according to the present embodiment may periodically repeat precursor supply operations S101b and S102b and evacuation operations S201 and S202. Each of the precursor supply operations S101b and S102b may include sequentially supplying two or more kinds of precursors of a TMD material to a reaction chamber. For example, in each of the precursor supply operations S101b and S102b, a precursor material (second precursor material) of a chalcogen element may be first supplied and then a precursor material (first precursor material) of a metal element may be supplied. In example embodiments, a reaction between a precursor of the chalcogen element supplied first on a substrate and a precursor of the subsequently supplied metal element may be performed well. Furthermore, in each of the precursor supply operations S101b and S102b, a catalytic gas in addition to the precursors may be further supplied.

Figure 4:
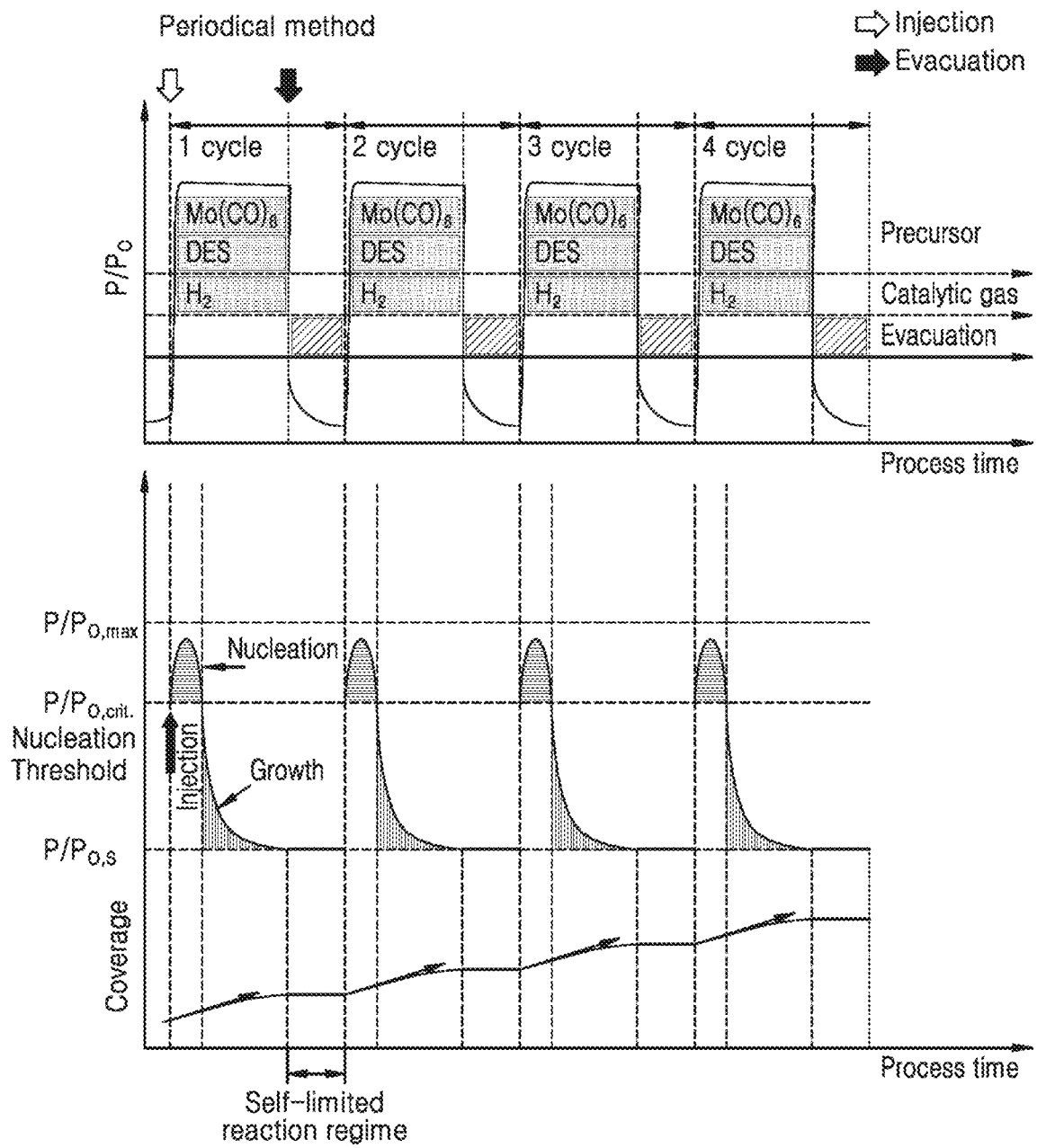
FIG. 4 is a graph for explaining a method (e.g., a periodical method) of growing a two-dimensional TMD thin film, according to an example embodiment.
Figure 5A:
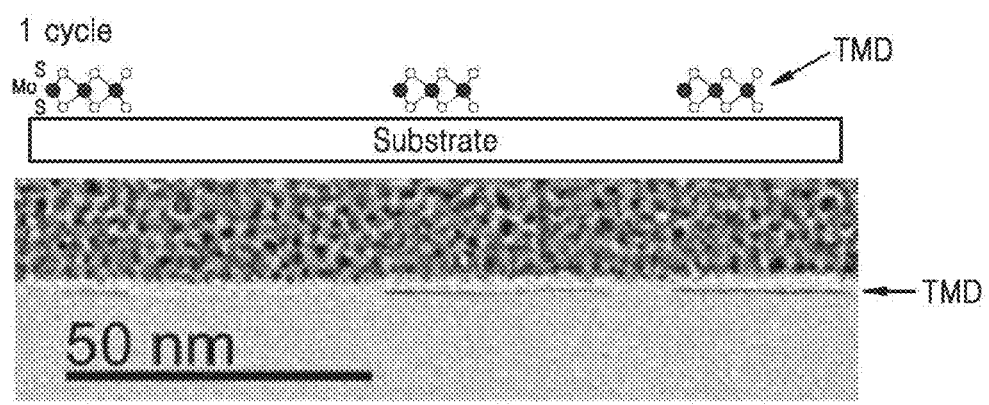
FIGS. 5A to 5D are views sequentially illustrating a process of growing a two-dimensional TMD thin film, according to an example embodiment.
Figure 5B:
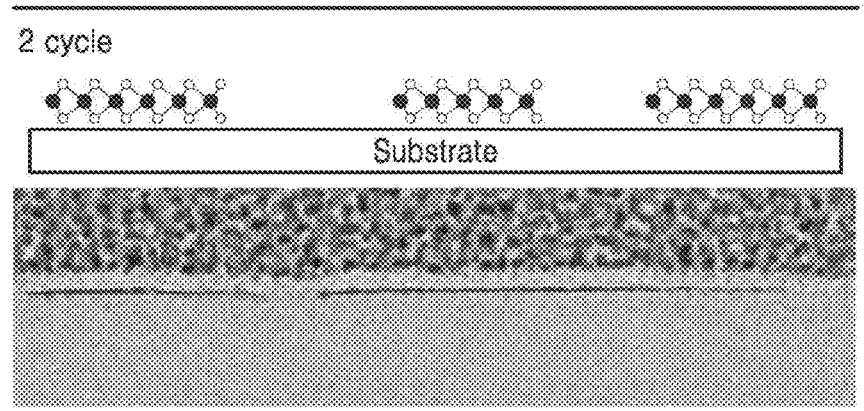
Figure 5C:
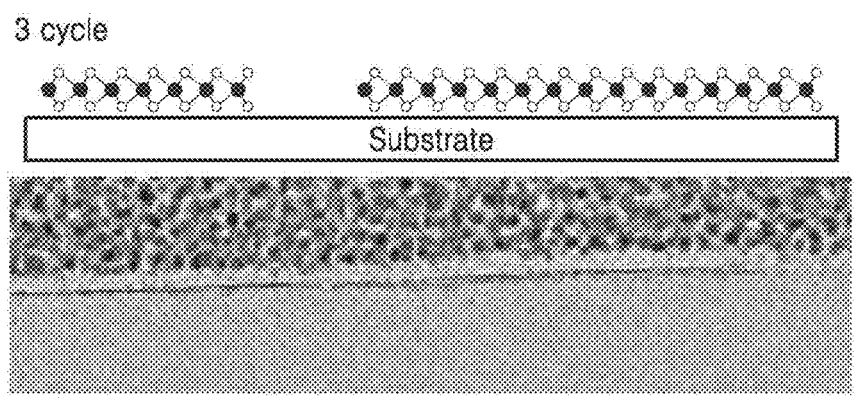
Figure 5D:
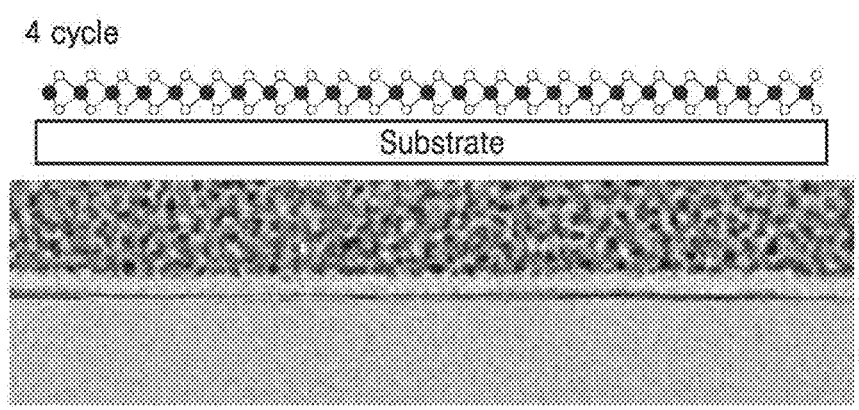

FIG. 4 is a graph for explaining a method (e.g., a periodical method) of growing a two-dimensional TMD thin film, according to an embodiment. The upper graph in FIG. 4 shows a partial pressure ($P/P_0$) of precursor (source) materials in a chamber with respect to a process time, and the lower graph in FIG. 4 shows nucleation and thin film growth in conjunction with a specific partial pressure ($P/P_0$) with respect to a process time. In the lower graph, "$P/P_{0,max}$" denotes a maximum partial pressure, "$P/P_{0,crit.}$" denotes a partial pressure at which nucleation begins to occur, and "$P/P_{0,S}$" denotes a partial pressure (or precursor concentration) at the surface of a substrate. "Coverage" denotes the ratio of lateral growth to vertical growth. The process time corresponding to the X-axis of the upper graph in FIG. 4 and the process time corresponding to the X-axis of the lower graph in FIG. 4 may correspond to each other.

Referring to the upper graph of FIG. 4, a precursor supply operation (Injection) and an evacuation operation (Evacuation) may be periodically performed alternately and repeatedly. For example, in the precursor supply operation (Injection), $Mo(CO)_6$, which is a precursor of Mo, and diethyl sulfide (DES), which is a precursor of S, may be supplied, and $H_2$ gas may also be supplied as a catalytic gas. In the evacuation operation (Evacuation), a process of evacuating by using a vacuum pump while injecting $N_2$ gas into the chamber may be performed. Here, although $Mo(CO)_6$ and DES are illustratively shown as precursor materials, various other precursor materials may be used. All of the precursors used to grow conventional TMD thin films may be applied to example embodiments herein.

Referring to the lower graph of FIG. 4, nucleation may occur in the precursor supply operation (Injection), followed by growth of a thin film. Here, the growth of the thin film may be mainly made laterally. In particular, by a region corresponding to the evacuation operation (Evacuation), vertical growth may be suppressed and prevented and lateral growth may be made. This may be referred to as a self-limited reaction region. By a periodic process including the evacuation operation (Evacuation), a nucleation rate may be controlled during the formation of a TMD thin film, and vertical growth may be suppressed and lateral growth may be promoted. Thus, a TMD thin film having uniform characteristics and a uniform thickness may be formed in a short time.

FIGS. 5A to 5D are views sequentially illustrating a process of growing a two-dimensional TMD thin film according to an example embodiment. FIGS. 5A, 5B, 5C, and 5D correspond to first, second, third, and fourth cycles, respectively. Each of FIGS. 5A, 5B, 5C, and 5D includes a transmission electron microscopy (TEM) cross-sectional image at the lower portion thereof (e.g., under a substrate), and a part that looks like a line in the middle of the TEM cross-sectional image is a two-dimensional TMD. The layer of a material above a two-dimensional TMD material in the TEM cross-sectional image is a platinum (Pt) coating layer required for TEM analysis sample preparation.

Referring to FIGS. 5A to 5D, as the process cycle proceeds, the TMD material is laterally grown to thereby form a two-dimensional thin film structure. According to example embodiments, vertical growth is suppressed and lateral growth is promoted, and thus, a TMD thin film having improved uniformity may be formed.

Figure 6A:
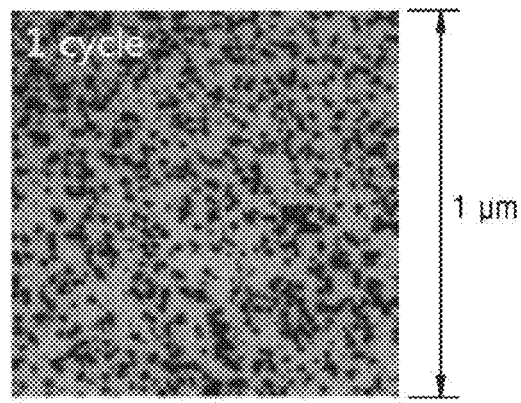
FIGS. 6A to 6C are plan views sequentially illustrating a process of growing a two-dimensional TMD thin film, according to an example embodiment.
Figure 6B:
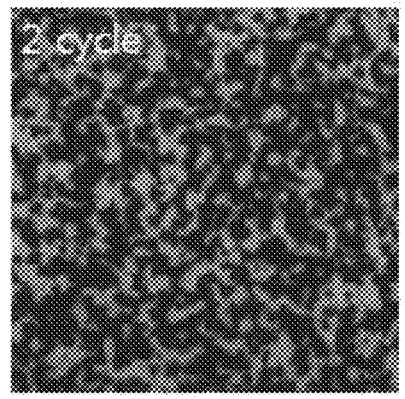
Figure 6C:
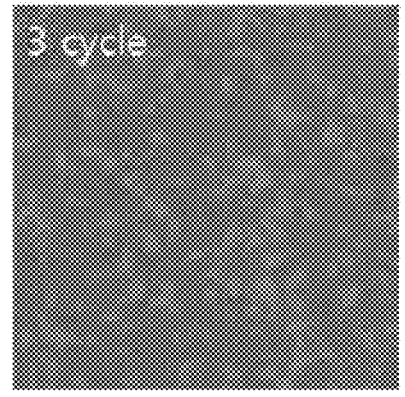

FIGS. 6A to 6C are plan views sequentially illustrating a process of growing a two-dimensional TMD thin film according to an embodiment. FIGS. 6A, 6B, and 6C correspond to FIGS. 5A, 5B, and 5C, respectively. As in FIGS. 5A to 5C, FIGS. 6A to 6C also show that as the process cycle proceeds, a TMD material is laterally grown to thereby form a two-dimensional thin film structure. When a TMD thin film having a monolayer structure is formed on a 6-inch wafer, a first layer (monolayer) may be uniformly formed in an area of about 95% or more of the TMD thin film and a second layer may be formed in a small area of about 5% or less of the TMD thin film.

Figure 7:
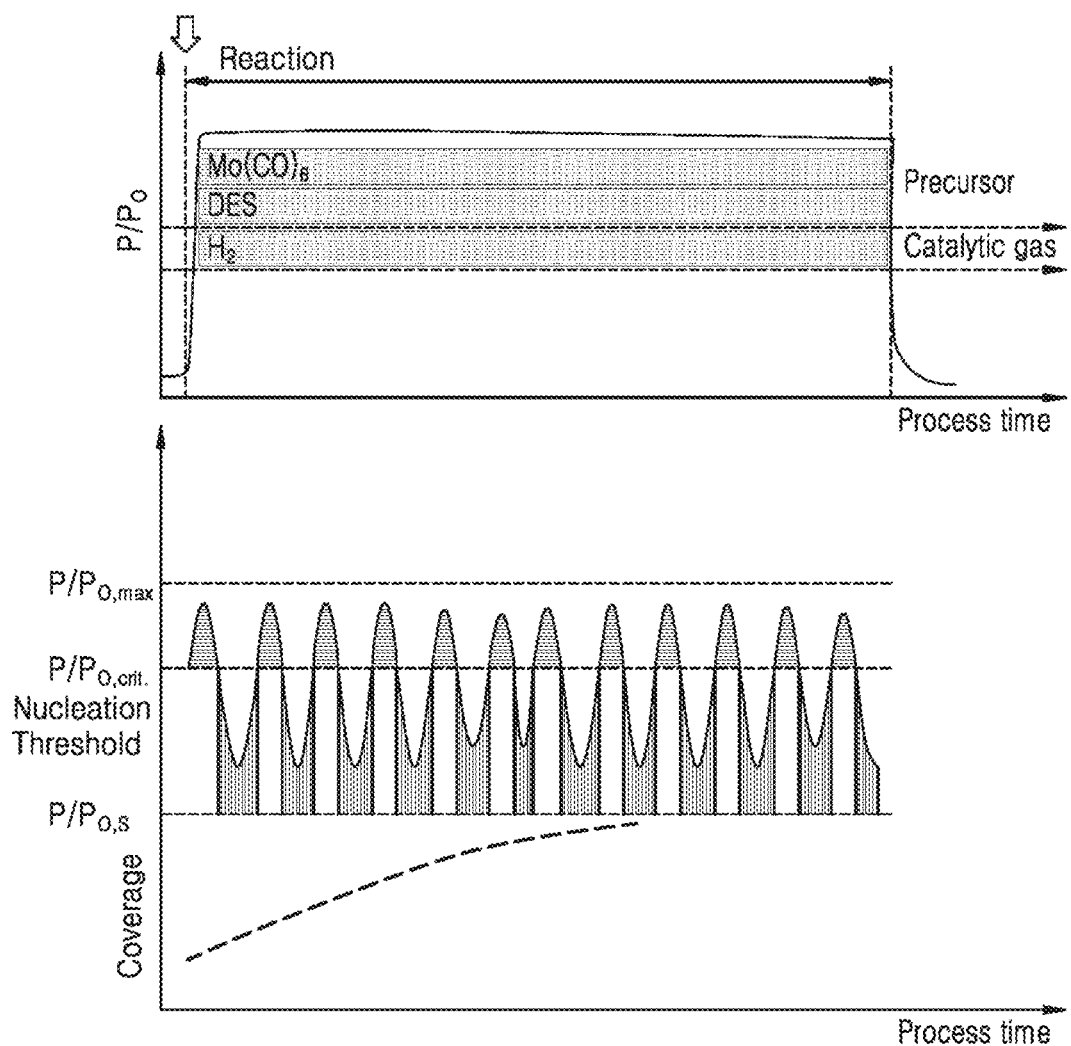
FIG. 7 is a graph for explaining a method (e.g., a static method) of growing a TMD thin film, according to a comparative example.

FIG. 7 is a graph for explaining a method (e.g., a static method) of growing a TMD thin film according to a comparative example. Upper and lower graphs of FIG. 7 and their X-axis and Y-axis values correspond to those described with reference to FIG. 4.

Referring to FIG. 7, in the method of growing a TMD thin film according to the comparative example, a periodic method is not used and a precursor and a catalytic gas may be continuously supplied. In this case, since it is difficult to control the vertical growth of a TMD thin film, it may be difficult to form a uniform single-layer TMD thin film. The mechanism of thin film growth shown in the lower graph of FIG. 7 may be illustrative and conceptual, and may actually appear differently.

Figure 8A:
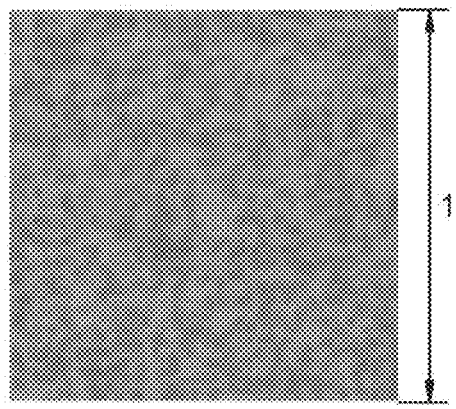
FIGS. 8A to 8C are plan views illustrating by time a process of growing a TMD thin film according to the comparative example of FIG. 7.
Figure 8B:
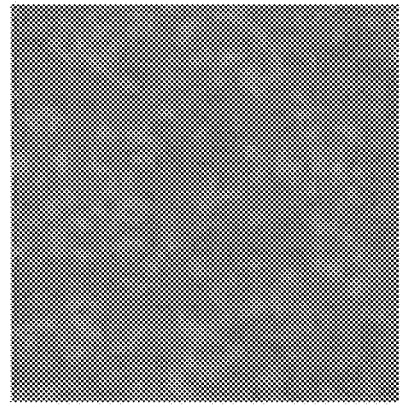
Figure 8C:
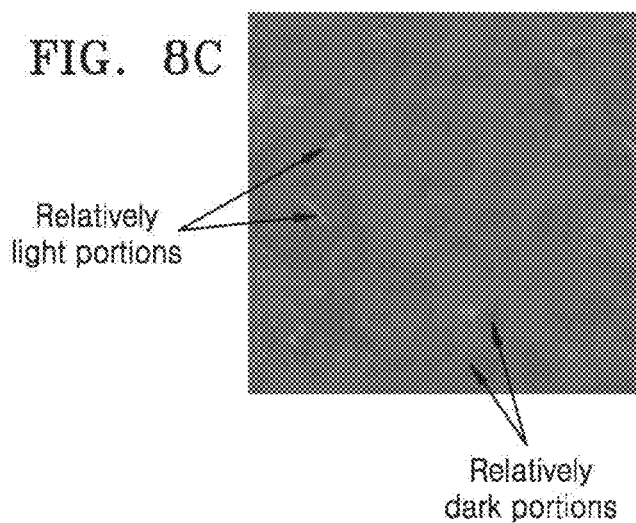

FIGS. 8A to 8C are plan views illustrating by time a process of growing a TMD thin film according to the comparative example of FIG. 7. Process times in FIGS. 8A, 8B, and 8C may correspond to process times in FIGS. 6A, 6B, and 6C, respectively.

Referring to FIG. 8C, a relatively dark portion and a relatively bright portion are mixed. The relatively dark portion corresponds to a relatively large proportion of the total. The relatively dark portion may be a portion where TMD is stacked more than two layers, and the relatively bright portion may be a portion where there is one TMD layer. With the method of the comparative example, it may be difficult to form a uniform TMD thin film.

Figure 9:
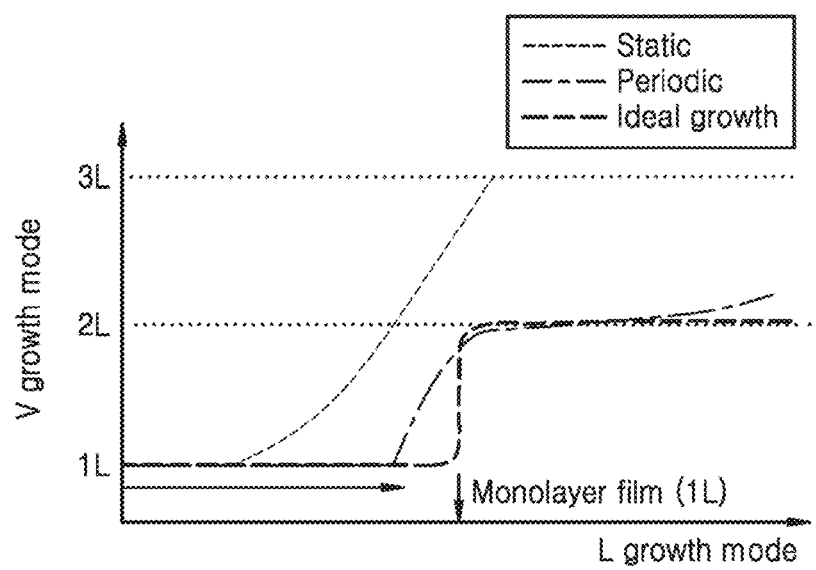
FIG. 9 is a graph showing a relationship between a lateral growth mode and a vertical growth mode in the TMD thin film growth methods according to example embodiments and the comparative example.

FIG. 9 is a graph showing a relationship between a lateral growth mode and a vertical growth mode in the TMD thin film growth methods according to an example embodiment and the comparative example. A graph indicated by "Periodic" in FIG. 9 corresponds to the example embodiment, and a graph indicated by "Static" in FIG. 9 corresponds to the comparative example. A graph indicated by "Ideal growth" corresponds to an ideal case. 1 L, 2 L, and 3 L on the Y axis of the graph mean the number of TMD layers (number of stacked layers).

Referring to FIG. 9, the graph corresponding to the example embodiment is almost similar to the graph corresponding to the ideal case. That is, a second layer is grown with a first monolayer film being almost formed. On the other hand, the graph corresponding to the comparative example shows that vertical growth and lateral growth proceed at a similar rate.

Figure 10:
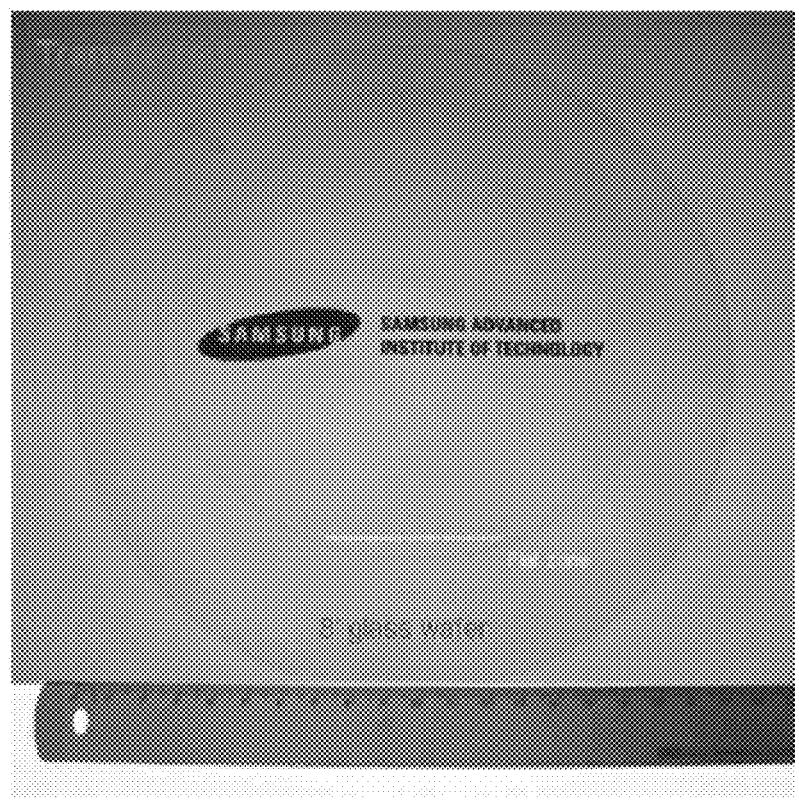
FIG. 10 is an image illustrating a case where a two-dimensional TMD thin film grown by the method according to example embodiments is transferred to a glass substrate.

FIG. 10 is an image illustrating a case where a two-dimensional TMD thin film grown by the method according to an example embodiment is transferred to a glass substrate.

The image is an image obtained by growing a two-dimensional TMD thin film ($MoS_2$ thin film) on a 6-inch substrate with the method according to an example embodiment and then transferring the two-dimensional TMD thin film to an 8-inch glass wafer. According to an example embodiment, it is possible to more easily form a higher-quality TMD thin film with a larger area.

Figure 11:
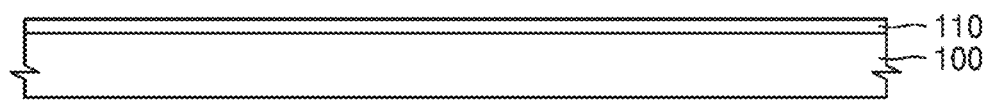
FIGS. 11 to 13 are cross-sectional views illustrating a two-dimensional TMD thin film grown by a method according to example embodiments.
Figure 12:
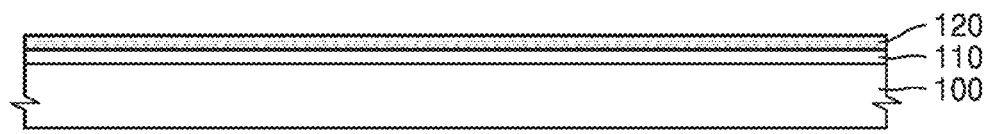
Figure 13:
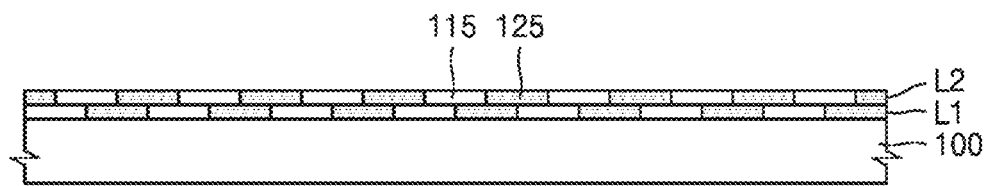

FIGS. 11 to 13 are cross-sectional views illustrating a two-dimensional TMD thin film grown by a method according to example embodiments.

Referring to FIG. 11, a two-dimensional TMD thin film 110 may be formed on a substrate 100. The two-dimensional TMD thin film 110 may include, for example, $MoS_2$, $MoSe_2$, $MoTe_2$, $WS_2$, $WTe_2$, $ZrS_2$, $ZrSe_2$, $HfS_2$, $HfSe_2$, $NbSe_2$, $ReSe_2$, or the like.

Referring to FIG. 12, a plurality of different TMD materials may be formed on a substrate 100 in a multi-layered structure. For example, a first TMD thin film 110 may be formed on the substrate 100, and a second TMD thin film 120 may be formed on the first TMD thin film 110, the second TMD thin film 120 being different from the first TMD thin film 110. The first TMD thin film 110 may be grown by using the method described with reference to FIGS. 1 to 6, and then the second TMD thin film 120, which is different from the first TMD thin film 110, may be formed on the first TMD thin film 110 by changing a precursor material (source material) and performing an additional thin film growth process. The first TMD thin film 110 and the second TMD thin film 120 may be alternately and repeatedly stacked. Three or more kinds of TMD thin films may be stacked in a desired order.

Referring to FIG. 13, a multi-layered structure including a plurality of different TMD materials may be formed on a substrate 100. For example, a first layer structure L1 and a second layer structure L2 may be stacked on the substrate 100. The first layer structure L1 may include a first TMD material region 115 and a second TMD material region 125. In addition, the second layer structure L2 may include a first TMD material region 115 and a second TMD material region 125. By changing a precursor material (source material) in the middle of forming each of the first and second layer structures L1 and L2 by using the method described with reference to FIGS. 1 to 6, the first and second layer structures L1 and L2 each including the first and second TMD material regions 115 and 125 may be formed. A multi-layered structure including three or more layer structures may be formed, and three or more kinds of TMD materials may be used. In addition, the TMD thin film formation method and the resultant structure thereof may be variously modified.

Figure 14:
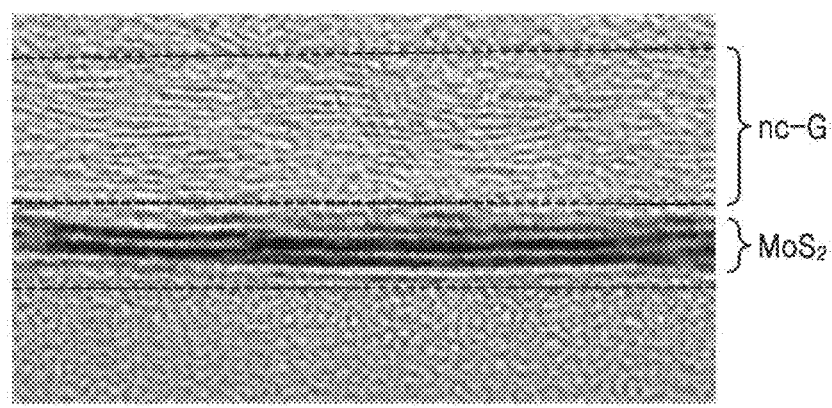
FIG. 14 is a TEM cross-sectional image illustrating a structure in which a two-dimensional TMD thin film ($MoS_2$ thin film) formed by the method according to example embodiments and nanocrystalline graphene (nc-G) formed thereon are stacked.

FIG. 14 is a TEM cross-sectional image illustrating a structure in which a two-dimensional TMD thin film ($MoS_2$ thin film) formed by the method according to an example embodiment and nanocrystalline graphene (nc-G) formed thereon are stacked.

Figure 15:
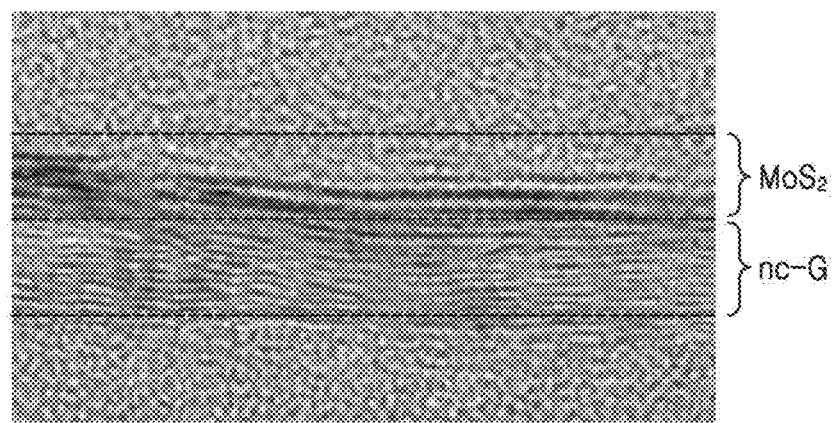
FIG. 15 is a TEM cross-sectional image illustrating a case where a two-dimensional TMD thin film ($MoS_2$ thin film) is formed on nanocrystalline graphene (nc-G) according to an example embodiment.

FIG. 15 is a TEM cross-sectional image illustrating a case where a two-dimensional TMD thin film ($MoS_2$ thin film) is formed on nanocrystalline graphene (nc-G) according to an example embodiment.

Referring to FIGS. 14 and 15, a hetero-junction structure of a two-dimensional material may be formed by stacking a plurality of different two-dimensional material thin films.

Figure 16:
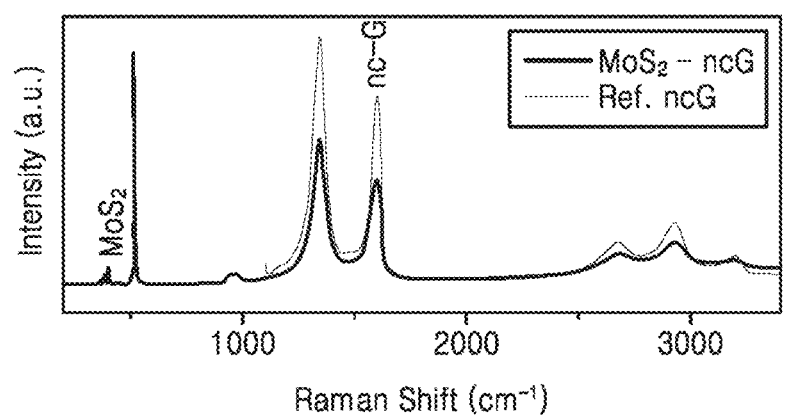
FIG. 16 is a graph showing a Raman spectrum analysis result of a stack structure of $MoS_2$ and nano-crystalline graphene nc-G, formed according to an example embodiment.

FIG. 16 is a graph showing a Raman spectrum analysis result of a stack structure (e.g., $MoS_2$-ncG structure) of $MoS_2$ and nano-crystalline graphene nc-G, formed according to an example embodiment. FIG. 16 also includes an analysis result of an nc-G thin film for comparison.

Referring to FIG. 16, a peak for MoS$_2$ and a peak for nc-G appear in the Raman spectrum analysis result of the MoS$_2$-ncG structure. On the other hand, a peak for MoS$_2$ does not appear in the analysis result of the nc-G thin film.

The method of growing a two-dimensional TMD thin film as described above may be applied to methods of manufacturing various devices (two-dimensional material-containing devices). Each of the methods of manufacturing the devices (the two-dimensional material-containing devices) may include an operation of growing a two-dimensional TMD thin film on a substrate by the method described above and an operation of forming a device portion including the two-dimensional TMD thin film. Here, examples of the devices (the two-dimensional material-containing devices) may include a transistor, a diode, an optoelectronic device, a tunneling device, a logic device, a memory device, and the like. The optoelectronic device may be a photoswitch, a photodetector, a photovoltaic device, or the like. In addition, the two-dimensional TMD thin film according to example embodiments may be applied as an interlayer between a metal and a semiconductor to control contact characteristics between the metal and the semiconductor. In addition, the two-dimensional TMD thin film according to example embodiments may be applied to various electronic devices in various fields. Moreover, the methods of the example embodiments are compatible with Si-based processes and thus may be easily applied to existing Si-based processes and devices. By using the methods of the example embodiments, a TMD thin film may be more easily formed with higher throughput, and thus, a device to which the TMD thin film is applied may be manufactured with high productivity and low cost.

Figure 17A:
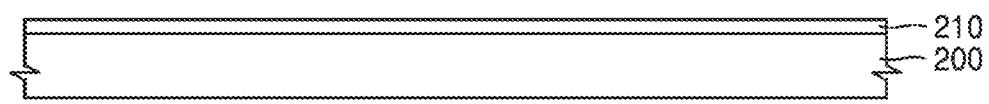
FIGS. 17A to 17C are cross-sectional views illustrating a method of manufacturing a two-dimensional material-containing device, according to an example embodiment.
Figure 17B:
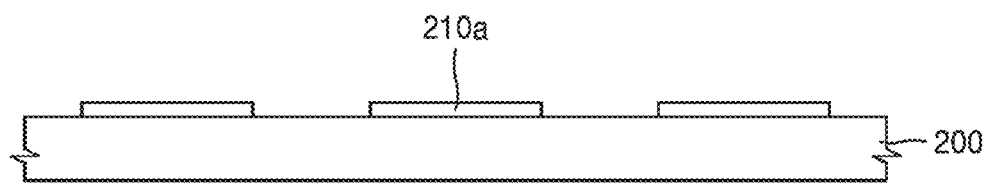
Figure 17C:
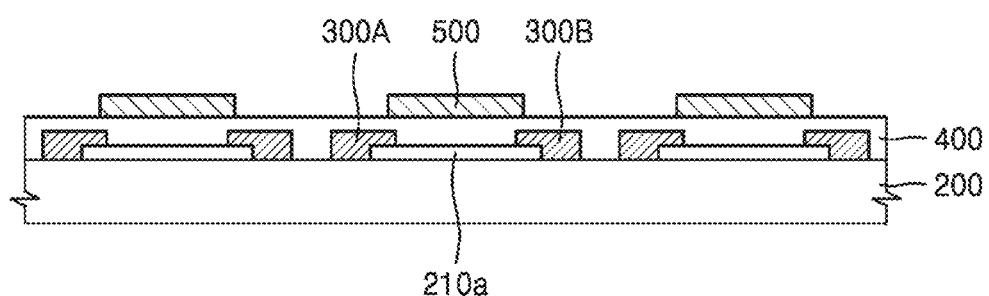

FIGS. 17A to 17C are cross-sectional views illustrating a method of manufacturing a two-dimensional material-containing device, according to an example embodiment.

Referring to FIG. 17A, a two-dimensional TMD thin film 210 may be formed on a substrate 200. The two-dimensional TMD thin film 210 having a large area may be formed in a wafer scale. The substrate 200 may be a growth substrate or a transfer substrate.

Referring to FIG. 17B, the two dimensional TMD thin film 210 may be patterned to form a patterned TMD thin film 210a. A plurality of patterned TMD thin films 210a may be formed.

Referring to FIG. 17C, a device portion including the patterned TMD thin film 210a may be formed on the substrate 200. For example, a source electrode 300A and a drain electrode 300B, which are in contact with both ends of the patterned TMD thin film 210a, may be formed, a gate insulating layer 400 covering the patterned TMD thin film 210a may be formed, and then a gate electrode 500 may be formed on the gate insulating layer 400. Through this process, a transistor element including the TMD thin film 210a may be manufactured. However, the method of manufacturing a two-dimensional material-containing device, described with reference to FIGS. 17A to 17C, is merely an example and may be variously modified.

Although many matters have been described above in detail, it should be understood that they are not intended to limit the scope of the present disclosure and are provided to give examples. For example, it would be apparent to those of ordinary skill in the art that various changes may be made to the method of growing a two-dimensional TMD thin film and the method of manufacturing a device using the two-dimensional TMD thin film, described with reference to FIGS. 1 to 6, 11 to 13, and 17A to 17C. Accordingly, the scope of the present disclosure should be determined not by the example embodiments set forth herein but by the technical idea defined in the appended claims.

What is claimed is:

1. A method of growing a two-dimensional transition metal dichalcogenide (TMD) thin film, the method comprising a precursor supply operation and an evacuation operation, which are periodically and repeatedly performed in a reaction chamber provided with a substrate for thin film growth, wherein
   the precursor supply operation comprises supplying two or more kinds of precursors of a TMD material to the reaction chamber, the evacuation operation comprises evacuating the two or more kinds of precursors and by-products generated therefrom from the reaction chamber, and
   wherein a single duration of the evacuation operation is shorter than a single duration of the precursor supply operation such that a vertical growth of the TMD thin film is suppressed and a lateral growth thereof is promoted relatively with respect to the vertical growth to control growth rate anisotropy.

2. The method of claim 1, wherein the precursor supply operation has a duration ranging from 30 seconds to 180 seconds in each period thereof.

3. The method of claim 1, wherein the evacuation operation has a duration ranging from 5 seconds to 120 seconds in each period thereof.

4. The method of claim 1, wherein a reaction temperature for growth of the two-dimensional TMD thin film ranges from 550° C. to 1050° C.

5. The method of claim 1, wherein the substrate comprises any one of Si, SiO$_2$, Al$_2$O$_3$, graphene, and a TMD material.

6. The method of claim 1, wherein, in the precursor supply operation, the two or more precursors are simultaneously or separately supplied into the reaction chamber.

7. The method of claim 1, wherein, in the precursor supply operation, a catalytic gas is further supplied together with the two or more precursors.

8. The method of claim 1, wherein the two-dimensional TMD thin film is grown using a chemical vapor deposition (CVD) process, a plasma-enhanced chemical vapor deposition (PECVD) process, a metal organic chemical vapor deposition (MOCVD) process, or a combination of at least two of them.

9. The method of claim 1, wherein the two or more kinds of precursors comprise a precursor material of at least one of metal elements of Groups 4B, 5B, 6B, and 7B and a precursor material of one of chalcogen elements of S, Se, and Te.

10. The method of claim 9, wherein the two or more precursors further comprise a precursor material of a doping element.

11. The method of claim 1, wherein a material of the two-dimensional TMD thin film is represented by MX$_2$,
   wherein M is one of Mo, W, Nb, V, Ta, Ti, Zr, Hf, Tc, and Re, and X is one of S, Se, and Te.

12. The method of claim 1, further comprising forming a plurality of TMD materials different from each other in a multi-layered structure.

13. The method of claim 1, wherein the two-dimensional TMD thin film is formed on a wafer having a size of 6 inches or more.

14. A method of manufacturing a two-dimensional material-containing device, the method comprising:
   growing a two-dimensional transition metal dichalcogenide (TMD) thin film on a substrate by using the method according to claim 1; and forming a device portion including the two-dimensional TMD thin film.

15. The method of claim 14, wherein the two-dimensional material-containing device comprises at least one of a transistor, a diode, an optoelectronic device, a tunneling device, a logic device, and a memory device.

* * * * *